(12) United States Patent
Sugimoto et al.

(10) Patent No.: US 11,740,452 B2
(45) Date of Patent: Aug. 29, 2023

(54) OPTICAL DEVICE

(71) Applicant: HAMAMATSU PHOTONICS K.K., Hamamatsu (JP)

(72) Inventors: Tatsuya Sugimoto, Hamamatsu (JP); Tomofumi Suzuki, Hamamatsu (JP); Kyosuke Kotani, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 476 days.

(21) Appl. No.: 16/625,702

(22) PCT Filed: Jul. 6, 2018

(86) PCT No.: PCT/JP2018/025640
§ 371 (c)(1),
(2) Date: Dec. 21, 2019

(87) PCT Pub. No.: WO2019/009398
PCT Pub. Date: Jan. 10, 2019

(65) Prior Publication Data
US 2021/0132368 A1    May 6, 2021

(30) Foreign Application Priority Data

Jul. 6, 2017 (JP) .................................. 2017-133093
Dec. 7, 2017 (JP) .................................. 2017-235021
(Continued)

(51) Int. Cl.
*G02B 26/08* (2006.01)
*B81B 3/00* (2006.01)
(Continued)

(52) U.S. Cl.
CPC ........ *G02B 26/0841* (2013.01); *B81B 3/0045* (2013.01); *G01J 3/021* (2013.01);
(Continued)

(58) Field of Classification Search
CPC ................................................ G02B 26/0841
See application file for complete search history.

(56) References Cited

U.S. PATENT DOCUMENTS 6,507,138 B1   1/2003   Rodgers et al.
7,699,296 B1   4/2010   Knollenberg et al.
(Continued)

FOREIGN PATENT DOCUMENTS

CN   1619351 A   5/2005
CN   1650214 A   8/2005
(Continued)

OTHER PUBLICATIONS

Akin Aydemir et al., "A new design and a fabrication approach to realize a high performance three axes capacitive MEMS accelerometer", Sensors and Actuators A Physical, vol. 244, Jun. 15, 2016, p. 324-p. 333.
(Continued)

*Primary Examiner* — Sung H Pak
*Assistant Examiner* — Hoang Q Tran
(74) *Attorney, Agent, or Firm* — Faegre Drinker Biddle & Reath LLP

(57) ABSTRACT

An optical device includes: a base that includes a main surface; a movable unit that includes an optical function unit; and an elastic support unit that is connected between the base and the movable unit, and supports the movable unit so that the movable unit is movable along a first direction perpendicular to the main surface. The elastic support unit includes a lever, a first torsion support portion that extends along a second direction perpendicular to the first direction and is connected between the lever and the movable unit, and a second torsion support portion that extends along the second direction and is connected between the lever and the base. A torsional spring constant of the first torsion support (Continued)

portion is greater than a torsional spring constant of the second torsion support portion.

6 Claims, 5 Drawing Sheets

(30) Foreign Application Priority Data

| | | |
|---|---|---|
| Dec. 7, 2017 | (JP) | 2017-235022 |
| Dec. 7, 2017 | (JP) | 2017-235025 |
| Apr. 19, 2018 | (JP) | 2018-080679 |

(51) Int. Cl.
  *G01J 3/02* (2006.01)
  *G01J 3/45* (2006.01)

(52) U.S. Cl.
  CPC ............. *G01J 3/0202* (2013.01); *G01J 3/45* (2013.01); *B81B 2201/033* (2013.01); *B81B 2201/042* (2013.01); *B81B 2203/0136* (2013.01); *B81B 2203/0154* (2013.01); *B81B 2203/04* (2013.01)

(56) References Cited

U.S. PATENT DOCUMENTS

| | | |
|---|---|---|
| 8,353,600 B1 | 1/2013 | Fu |
| 8,729,770 B1 | 5/2014 | Milanovic |
| 11,187,872 B2 | 11/2021 | Sugimoto et al. |
| 2002/0109894 A1 | 8/2002 | Clark et al. |
| 2004/0004775 A1 | 1/2004 | Turner et al. |
| 2004/0081391 A1 | 4/2004 | Ko et al. |
| 2004/0232107 A1 | 11/2004 | Kouma et al. |
| 2005/0099665 A1 | 5/2005 | Lee et al. |
| 2005/0194650 A1 | 9/2005 | Hung |
| 2005/0194840 A1 | 9/2005 | Mori et al. |
| 2006/0082250 A1 | 4/2006 | Ko et al. |
| 2008/0123242 A1* | 5/2008 | Zhou ............ H01G 5/16 361/290 |
| 2008/0198249 A1 | 8/2008 | Tanimura et al. |
| 2008/0247029 A1 | 10/2008 | Zhou |
| 2008/0284078 A1 | 11/2008 | Wolter et al. |
| 2009/0107949 A1 | 4/2009 | Kouma et al. |
| 2009/0109512 A1 | 4/2009 | Park |
| 2009/0225387 A1 | 9/2009 | Mizuno et al. |
| 2010/0208347 A1 | 8/2010 | Kouma et al. |
| 2011/0080627 A1 | 4/2011 | He et al. |
| 2011/0090551 A1 | 4/2011 | Pirk et al. |
| 2011/0109194 A1 | 5/2011 | Hung et al. |
| 2011/0205608 A1 | 8/2011 | Mizoguchi |
| 2012/0099176 A1 | 4/2012 | Zhou |
| 2012/0160557 A1 | 6/2012 | Yamada et al. |
| 2012/0162739 A1 | 6/2012 | Yamada |
| 2012/0236382 A1 | 9/2012 | Puegner et al. |
| 2013/0083379 A1 | 4/2013 | Tanaka et al. |
| 2013/0321892 A1 | 12/2013 | Haeberle et al. |
| 2014/0125950 A1 | 5/2014 | Shimada et al. |
| 2014/0137670 A1 | 5/2014 | Hata et al. |
| 2014/0300942 A1 | 10/2014 | Van Lierop et al. |
| 2014/0327946 A1 | 11/2014 | Van Lierop et al. |
| 2014/0355091 A1 | 12/2014 | Mizutani |
| 2014/0362460 A1 | 12/2014 | Nozu et al. |
| 2015/0028698 A1 | 1/2015 | Gutierrez |
| 2015/0234176 A1 | 8/2015 | Zhou |
| 2016/0216508 A1 | 7/2016 | Tamamori |
| 2017/0139200 A1 | 5/2017 | Chang et al. |

FOREIGN PATENT DOCUMENTS

| | | |
|---|---|---|
| CN | 1790181 A | 6/2006 |
| CN | 1837892 A | 9/2006 |
| CN | 101246258 A | 8/2008 |
| CN | 101279708 A | 10/2008 |
| CN | 101284642 A | 10/2008 |
| CN | 101290395 A | 10/2008 |
| CN | 101316789 A | 12/2008 |
| CN | 101410744 A | 4/2009 |
| CN | 101786592 A | 7/2010 |
| CN | 101894711 A | 11/2010 |
| CN | 102177465 A | 9/2011 |
| CN | 102265033 A | 11/2011 |
| CN | 102369153 A | 3/2012 |
| CN | 102667497 A | 9/2012 |
| CN | 102868383 A | 1/2013 |
| CN | 103288034 A | 9/2013 |
| CN | 103803478 A | 5/2014 |
| CN | 203825034 U | 9/2014 |
| CN | 104216109 A | 12/2014 |
| CN | 104272167 A | 1/2015 |
| CN | 104348326 A | 2/2015 |
| CN | 104428439 A | 3/2015 |
| CN | 104964678 A | 10/2015 |
| CN | 105453408 A | 3/2016 |
| CN | 105492879 A | 4/2016 |
| CN | 105594114 A | 5/2016 |
| CN | 105826252 A | 8/2016 |
| CN | 105899995 A | 8/2016 |
| CN | 106500682 A | 3/2017 |
| CN | 106597016 A | 4/2017 |
| CN | 106604887 A | 4/2017 |
| CN | 106707415 A | 5/2017 |
| EP | 1677086 A1 | 7/2006 |
| EP | 3015901 A1 | 5/2016 |
| EP | 3070508 A1 | 9/2016 |
| JP | H8-506857 A | 7/1996 |
| JP | 2000214407 A * | 8/2000 ......... G02B 26/0841 |
| JP | 2002-524271 A | 8/2002 |
| JP | 2002-326197 A | 11/2002 |
| JP | 2003-029178 A | 1/2003 |
| JP | 2004-177543 A | 6/2004 |
| JP | 2004-215534 A | 8/2004 |
| JP | 2004-325578 A | 11/2004 |
| JP | 2005-010453 A | 1/2005 |
| JP | 2005-275198 A | 10/2005 |
| JP | 2006-343481 A | 12/2006 |
| JP | 2007-155965 A | 6/2007 |
| JP | 2007-183400 A | 7/2007 |
| JP | 2007-188073 A | 7/2007 |
| JP | 2008-055516 A | 3/2008 |
| JP | 2008-083122 A | 4/2008 |
| JP | 2009-171394 A | 7/2009 |
| JP | 2010-008611 A | 1/2010 |
| JP | 2010-029976 A | 2/2010 |
| JP | 2010-054944 A | 3/2010 |
| JP | 2010-085506 A | 4/2010 |
| JP | 2010-128116 A | 6/2010 |
| JP | 2010-184334 A | 8/2010 |
| JP | 2011-069954 A | 4/2011 |
| JP | 2011-175044 A | 9/2011 |
| JP | 2012-042666 A | 3/2012 |
| JP | 2012-108165 A | 6/2012 |
| JP | 2012-133242 A | 7/2012 |
| JP | 2012-184962 A | 9/2012 |
| JP | 2012-524295 A | 10/2012 |
| JP | 2012-528343 A | 11/2012 |
| JP | 2013-009447 A | 1/2013 |
| JP | 2013-016651 A | 1/2013 |
| JP | 2013-148707 A | 8/2013 |
| JP | 2014-006418 A | 1/2014 |
| JP | 2014-023207 A | 2/2014 |
| JP | 2014-035429 A | 2/2014 |
| JP | 2014-115267 A | 6/2014 |
| JP | 2014-215534 A | 11/2014 |
| JP | 2014-235260 A | 12/2014 |
| JP | 2014-238581 A | 12/2014 |
| JP | 2015-093340 A | 5/2015 |
| JP | 2015-102483 A | 6/2015 |
| JP | 2015-219516 A | 12/2015 |
| JP | 2016-085299 A | 5/2016 |
| JP | 2016-114798 A | 6/2016 |
| JP | 2016-151681 A | 8/2016 |
| JP | 2016-200834 A | 12/2016 |

(56) References Cited

FOREIGN PATENT DOCUMENTS

| JP | 2016-212221 A | 12/2016 |
|---|---|---|
| JP | 2017-058418 A | 3/2017 |
| JP | 2017-070163 A | 4/2017 |
| JP | 2017-129783 A | 7/2017 |
| TW | 201531709 A | 8/2015 |
| TW | I563290 B | 12/2016 |
| TW | 201717371 A | 5/2017 |
| TW | 201718896 A | 6/2017 |
| TW | I588533 B | 6/2017 |
| WO | WO 94/018697 A1 | 8/1994 |
| WO | WO-00/013210 A2 | 3/2000 |
| WO | WO 2009/124607 A1 | 10/2009 |
| WO | WO-2010/121185 A1 | 10/2010 |
| WO | WO-2010/136358 A2 | 12/2010 |
| WO | WO 2011/091012 A2 | 7/2011 |
| WO | WO-2013/046612 A1 | 4/2013 |
| WO | WO 2015/068400 A1 | 5/2015 |
| WO | WO 2016/002453 A1 | 1/2016 |

OTHER PUBLICATIONS

Sandner, Thilo et al., "Out-of-plane translatory MEMS actuator with extraordinary large stroke for optical path length modulation in miniaturized FTIR Spectrometers," SENSOR+TEST Conferences 2011, Proceedings IRS2, Jun. 9, 2011, pp. 151-156.
International Preliminary Report on Patentability dated Jan. 16, 2020 for PCT/JP2018/025639.
International Preliminary Report on Patentability dated Jan. 16, 2020 for PCT/JP2018/025638.
International Preliminary Report on Patentability dated Jan. 16, 2020 for PCT/JP2018/025637.
International Preliminary Report on Patentability dated Jan. 16, 2020 for PCT/JP2018/025636.
International Preliminary Report on Patentability dated Jan. 16, 2020 for PCT/JP2018/025635.
International Preliminary Report on Patentability dated Jan. 16, 2020 for PCT/JP2018/025634.
International Preliminary Report on Patentability dated Jan. 16, 2020 for PCT/JP2018/025640.
English-language translation of International Preliminary Report on Patentability (IPRP) dated May 28, 2020 that issued in WO Patent Application No. PCT/JP2018/029117.
Sun Fengming et al., "MEMS Based Micro Displacemont Sensor and Its Application", Chinese Journal of Sensors and Actuators, vol. 26, No. 2, Feb. 2013, p. 293-p. 296.
English-language translation of International Preliminary Report on Patentability (IPRP) dated May 28, 2020 that issued in WO Patent Application No. PCT/JP2018/032760.
Sandner Thilo et al., "Translatory MEMS actuator and their system integration for miniaturized Fourier transform spectrometers", MOEMS and Miniaturized Systems XI, SPIE, 1000 20th St. Bellingham WA 98225-6705 USA, vol. 8252, No. 1, Mar. 8, 2012, p. 1-p. 10, XP060023646.
Anonymous, "Michelson Interferometer—Definition and Applications", URL:https://www.azooptics.com/Article.aspx?ArticleID= 698, May 6, 2014, XP093017159.

* cited by examiner

OPTICAL DEVICE

TECHNICAL FIELD

The present disclosure relates to an optical device that is constituted, for example, as a micro electro mechanical systems (MEMS) device.

BACKGROUND ART

As the MEMS device, an optical device including a base, a movable unit including an optical function unit, and an elastic support unit that is connected between the base and the movable unit and supports the movable unit so that the movable unit is movable along a movement direction is known (for example, refer to Patent Literature 1). In the optical device, the elastic support unit may include a torsion support portion that is twisted when the movable unit moves along a movement direction.

CITATION LIST

Patent Literature

Patent Literature 1: US Unexamined Patent Publication No. 2008/0284078

SUMMARY OF INVENTION

Technical Problem

In the above-described optical device, it is considered that a torsion support portion is made to be easily twisted by narrowing a width of the torsion support portion so that the movable unit is movable greatly along a movement direction. However, in the configuration, in a case where a deviation occurs in a shape of the torsion support portion due to a manufacturing error or the like, there is a concern that the movable unit is inclined from a target posture when the movable unit moves in the movement direction, and as a result, optical characteristics deteriorate.

An object of the present disclosure is to provide an optical device capable of suppressing a deterioration of optical characteristics which is caused by a variation of a shape of a torsion support portion.

Solution to Problem

According to an aspect of the present disclosure, there is provided an optical device including: a base that includes a main surface; a movable unit that includes an optical function unit; and an elastic support unit that is connected between the base including the main surface and the movable unit, and supports the movable unit so that the movable unit is movable along a first direction perpendicular to the main surface. The elastic support unit includes a lever, a first torsion support portion that extends along a second direction perpendicular to the first direction and is connected between the lever and the movable unit, and a second torsion support portion that extends along the second direction and is connected between the lever and the base. A torsional spring constant of the first torsion support portion is greater than a torsional spring constant of the second torsion support portion.

In the optical device, the torsional spring constant of the first torsion support portion connected between the lever and the movable unit is greater than the torsional spring constant of the second torsion support portion connected between the lever and the base. According to this, even in a case where a deviation occurs in a shape of at least one of the first torsion support portion and the second torsion support portion due to a manufacturing error or the like, it is possible to suppress the movable unit from being inclined from a target posture when the movable unit moves in the first direction. As a result, according to the optical device, it is possible to suppress a deterioration of optical characteristics which is caused by a variation of the shape of the torsion support portion.

In the optical device according to the aspect of the present disclosure, a width of the first torsion support portion may be wider than a width of the second torsion support portion when viewed from the first direction. In this case, it is possible to make the torsional spring constant of the first torsion support portion be appropriately greater than the torsional spring constant of the second torsion support portion.

In the optical device according to the aspect of the present disclosure, a length of the first torsion support portion may be shorter than a length of the second torsion support portion when viewed from the first direction. In this case, it is possible to make the torsional spring constant of the first torsion support portion be more appropriately greater than the torsional spring constant of the second torsion support portion.

In the optical device according to the aspect of the present disclosure, the base, the movable unit, and the elastic support unit may be constituted by an SOI substrate. In this case, in the optical device formed by an MEMS technology, it is possible to suppress a deterioration of optical characteristics which is caused by the variation of the shape of the torsion support portion.

The optical device according to the aspect of the present disclosure may further include: a fixed comb electrode that is provided in the base and includes a plurality of fixed comb fingers; and a movable comb electrode that is provided in at least one of the movable unit and the elastic support unit and includes a plurality of movable comb fingers which are disposed alternately with the plurality of fixed comb fingers. In this case, it is possible to realize simplification and low power consumption of an actuator unit configured to move the movable unit.

The optical device according to the aspect of the present disclosure may include the elastic support unit only in a pair. In this case, for example, it is possible to further stabilize an operation of the movable unit in comparison to a case where only one piece of the elastic support unit is provided. In addition, it is possible to further reduce a total number of the torsion support portions in comparison to a case where three or more elastic support units are provided. As a result, it is possible to secure a spring constant of each of the torsion support portions, and it may be less likely to be susceptible to an influence due to the variation of the shape of the torsion support portion.

Advantageous Effects of Invention

According to the aspect of the present disclosure, it is possible to provide an optical device capable of suppressing a deterioration of optical characteristics which is caused by a variation of a shape of a torsion support portion.

DESCRIPTION OF EMBODIMENTS

Figure 1:
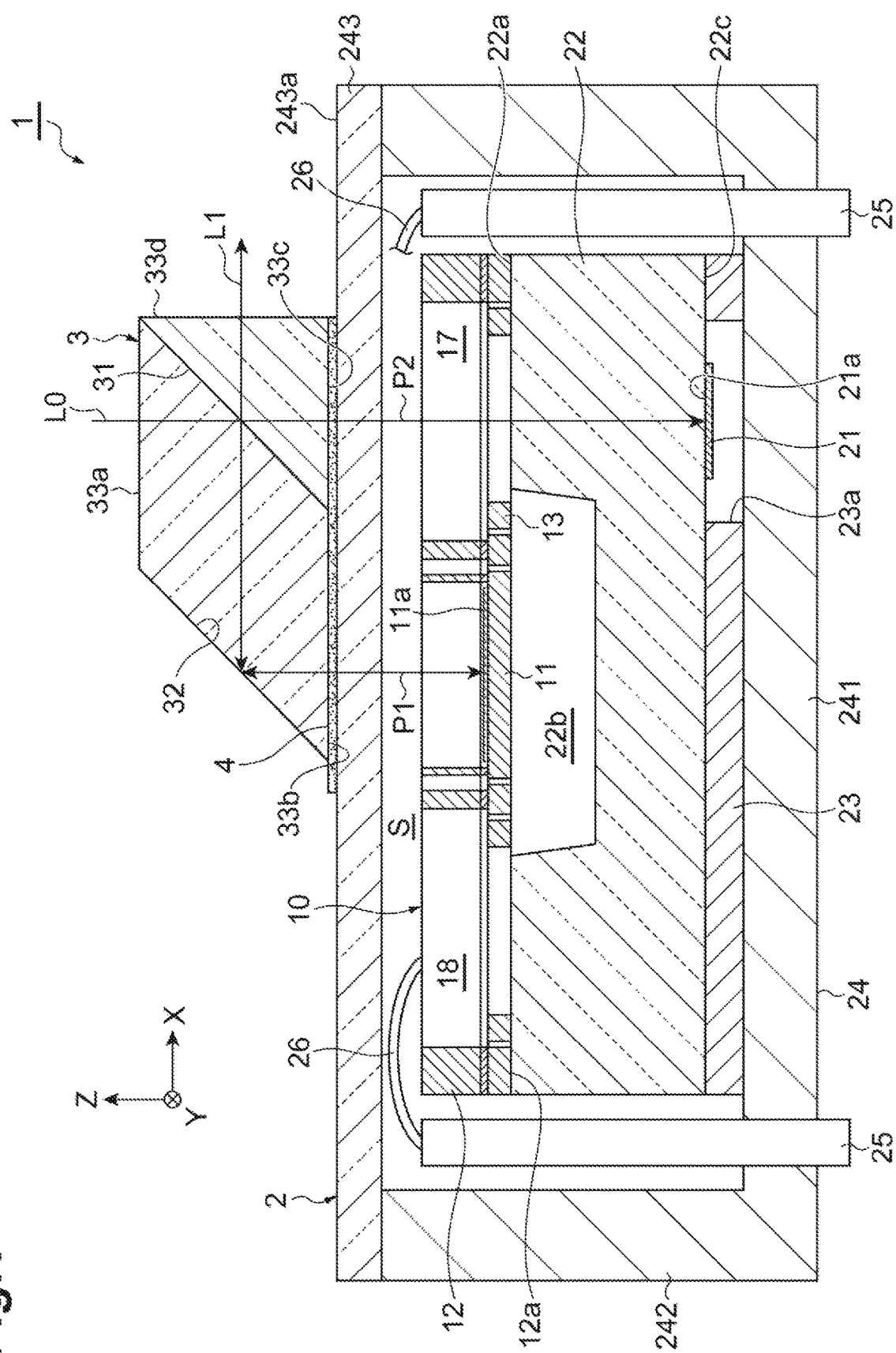
FIG. 1 is a vertical cross-sectional view of an optical module including an optical device according to an embodiment.

Hereinafter, an embodiment according to an aspect of the present disclosure will be described in detail with reference to the accompanying drawings. In the following description, the same reference numeral will be given to the same or equivalent parts in the respective drawings, and redundant description thereof will be omitted.

[Configuration of Optical Module]

As illustrated in FIG. 1, an optical module 1 includes a mirror unit 2 and a beam splitter unit 3. The mirror unit 2 includes an optical device 10 and a fixed mirror 21. The optical device 10 includes a movable mirror (movable unit) 11. In the optical module 1, an interference optical system is constituted by the beam splitter unit 3, the movable mirror 11, and the fixed mirror 21 with respect to measurement light L0. Here, the interference optical system is a Michelson interference optical system.

The optical device 10 includes a base 12, a drive unit 13, a first optical function unit 17, and a second optical function unit 18 in addition to the movable mirror 11. The base 12 includes a main surface 12a. The movable mirror 11 includes a mirror surface (optical function unit) 11a along a plane parallel to the main surface 12a. The movable mirror 11 is supported in the base 12 to be movable along a Z-axis direction (a direction parallel to a Z-axis, a first direction) perpendicular to the main surface 12a. The drive unit 13 moves the movable mirror 11 along the Z-axis direction. The first optical function unit 17 is disposed on one side of the movable mirror 11 in an X-axis direction (a direction parallel to an X-axis, a third direction) perpendicular to the Z-axis direction when viewed from the Z-axis direction. The second optical function unit 18 is disposed on the other side of the movable mirror 11 in the X-axis direction when viewed from the Z-axis direction. The first optical function unit 17 and the second optical function unit 18 are light passage openings provided in the base 12, and are respectively opened to one side and the other side in the Z-axis direction. In the optical module 1, the second optical function unit 18 is not used as the light passage opening. In a case where the optical device 10 is applied to another device, at least one of the first optical function unit 17 and the second optical function unit 18 may be used as an optical function unit, or both the first optical function unit 17 and the second optical function unit 18 may not be used as the optical function unit.

The fixed mirror 21 includes a mirror surface 21a that extends along a plane (plane perpendicular to the Z-axis direction) parallel to the main surface 12a. A position of the fixed mirror 21 with respect to the base 12 is fixed. In the mirror unit 2, the mirror surface 11a of the movable mirror 11 and the mirror surface 21a of the fixed mirror 21 face one side (the beam splitter unit 3 side) in the Z-axis direction.

The mirror unit 2 includes a support 22, a sub-mount 23, and a package 24 in addition to the optical device 10 and the fixed mirror 21. The package 24 accommodates the optical device 10, the fixed mirror 21, the support 22, and the sub-mount 23. The package 24 includes a bottom wall 241, a side wall 242, and a ceiling wall 243. For example, the package 24 is formed in a rectangular parallelepiped box shape. For example, the package 24 has a size of approximately 30×25×10 (thickness) mm. The bottom wall 241 and the side wall 242 are integrally formed. The ceiling wall 243 faces the bottom wall 241 in the Z-axis direction, and is fixed to the side wall 242. The ceiling wall 243 has optical transparency with respect to the measurement light L0. In the mirror unit 2, a space S is formed by the package 24. For example, the space S is opened to the outside of the mirror unit 2 through a ventilation hole or a gap that is formed in the package 24. In a case where the space S is not an air-tight space as described above, it is possible to suppress contamination, hazing, or the like of the mirror surface 11a which is caused by an out-gas from a resin material that exists in the package 24, a moisture that exists in the package 24, or the like. The space S may be an air-tight space in which the degree of vacuum is maintained to be high, or an air-tight space filled with an inert gas such as nitrogen.

A support 22 is fixed to an inner surface of the bottom wall 241 through the sub-mount 23. For example, the support 22 is formed in a rectangular plate shape. The support 22 has optical transparency with respect to the measurement light L0. The base 12 of the optical device 10 is fixed to a surface 22a of the support 22 on a side opposite to the sub-mount 23. That is, the base 12 is supported by the support 22. A concave portion 22b is formed in the surface 22a of the support 22, and a gap (a part of the space S) is formed between the optical device 10 and the ceiling wall 243. Accordingly, when the movable mirror 11 is caused to move along the Z-axis direction, the movable mirror 11 and the drive unit 13 are prevented from coming into contact with the support 22 and the ceiling wall 243.

An opening 23a is formed in the sub-mount 23. The fixed mirror 21 is disposed on a surface 22c of the support 22 on the sub-mount 23 side to be located in the opening 23a. That is, the fixed mirror 21 is disposed on the surface 22c of the support 22 on a side opposite to the base 12. The fixed mirror 21 is disposed on one side of the movable mirror 11 in the X-axis direction when viewed from the Z-axis direction. The fixed mirror 21 overlaps the first optical function unit 17 of the optical device 10 when viewed from the Z-axis direction.

The mirror unit 2 further includes a plurality of lead pins 25 and a plurality of wires 26. The lead pins 25 are fixed to the bottom wall 241 in a state of penetrating the bottom wall 241. The lead pins 25 are electrically connected to the drive unit 13 through the wires 26. In the mirror unit 2, an electric signal for moving the movable mirror 11 along the Z-axis direction is applied to the drive unit 13 through the plurality of lead pins 25 and the plurality of wires 26.

The beam splitter unit 3 is supported by the ceiling wall 243 of the package 24. Specifically, the beam splitter unit 3 is fixed to a surface 243a of the ceiling wall 243 on a side opposite to the optical device 10 by an optical resin 4. The optical resin 4 has optical transparency with respect to the measurement light L0.

The beam splitter unit 3 includes, a half mirror surface 31, a total reflection mirror surface 32 and a plurality of optical surfaces 33a, 33b, 33c, and 33d. The beam splitter unit 3 is constituted by joining a plurality of optical blocks. For example, the half mirror surface 31 is formed by a dielectric multi-layer film. For example, the total reflection mirror surface 32 is formed by a metal film.

For example, the optical surface 33a is a surface that is perpendicular to the Z-axis direction, and overlaps the first optical function unit 17 of the optical device 10 and the mirror surface 21a of the fixed mirror 21 when viewed from the Z-axis direction. The optical surface 33a allows the measurement light L0 incident along the Z-axis direction to be transmitted therethrough.

For example, the half mirror surface 31 is a surface that is inclined at an angle of 45° with respect to the optical surface 33a, and overlaps the first optical function unit 17 of the optical device 10 and the mirror surface 21a of the fixed mirror 21 when viewed from the Z-axis direction. The half mirror surface 31 reflects a part of the measurement light L0, which is incident to the optical surface 33a along the Z-axis direction, along the X-axis direction, and allows the remainder of the measurement light L0 to be transmitted therethrough toward the fixed mirror 21 side along the Z-axis direction.

The total reflection mirror surface 32 is a surface that is parallel to the half mirror surface 31, overlaps the mirror surface 11a of the movable mirror 11 when viewed from the Z-axis direction, and overlaps the half mirror surface 31 when viewed from the X-axis direction. The total reflection mirror surface 32 reflects the part of the measurement light L0 which is reflected by the half mirror surface 31 toward the movable mirror 11 side along the Z-axis direction.

The optical surface 33b is a surface that is parallel to the optical surface 33a, and overlaps the mirror surface 11a of the movable mirror 11 when viewed from the Z-axis direction. The optical surface 33b allows the part of the measurement light L0 which is reflected by the total reflection mirror surface 32 to be transmitted therethrough toward the movable mirror 11 side along the Z-axis direction.

The optical surface 33c is a surface that is parallel to the optical surface 33a, and overlaps the mirror surface 21a of the fixed mirror 21 when viewed from the Z-axis direction. The optical surface 33c allows the remainder of the measurement light L0 which is transmitted through the half mirror surface 31 to be transmitted therethrough toward the fixed mirror 21 side along the Z-axis direction.

For example, the optical surface 33d is a surface that is perpendicular to the X-axis direction, and overlaps the half mirror surface 31 and the total reflection mirror surface 32 when viewed from the X-axis direction. The optical surface 33d allows measurement light L1 to be transmitted therethrough along the X-axis direction. The measurement light L1 is interference light of the part of the measurement light L0 which is sequentially reflected by the mirror surface 11a of the movable mirror 11 and the total reflection mirror surface 32 and is transmitted through the half mirror surface 31, and the remainder of the measurement light L0 which is sequentially reflected by the mirror surface 21a of the fixed mirror 21 and the half mirror surface 31.

In the optical module 1 constituted as described above, when the measurement light L0 is incident to the beam splitter unit 3 from the outside of the optical module 1 through the optical surface 33a, a part of the measurement light L0 is sequentially reflected by the half mirror surface 31 and the total reflection mirror surface 32, and proceeds through the mirror surface 11a of the movable mirror 11. In addition, the part of the measurement light L0 is reflected by the mirror surface 11a of the movable mirror 11, proceeds on the same optical path (an optical path P1 to be described later) in an opposite direction, and is transmitted through the half mirror surface 31 of the beam splitter unit 3.

On the other hand, the remainder of the measurement light L0 is transmitted through the half mirror surface 31 of the beam splitter unit 3, passes through the first optical function unit 17, is transmitted through the support 22, and proceeds toward the mirror surface 21a of the fixed mirror 21. In addition, the remainder of the measurement light L0 is reflected by the mirror surface 21a of the fixed mirror 21, proceeds on the same optical path (an optical path P2 to be described later) in an opposite direction, and is reflected by the half mirror surface 31 of the beam splitter unit 3.

The part of the measurement light L0 which is transmitted through the half mirror surface 31 of the beam splitter unit 3, and the remainder of the measurement light L0 which is reflected by the half mirror surface 31 of the beam splitter unit 3 become the measurement light L1 that is interference light, and the measurement light L1 is emitted from the beam splitter unit 3 to the outside of the optical module 1 through the optical surface 33d. According to the optical module 1, it is possible to reciprocate the movable mirror 11 at a high speed along the Z-axis direction, and thus it is possible to provide a small-sized high-accuracy Fourier transformation type infrared spectral analyzer (FTIR).

The support 22 corrects an optical path difference between the optical path P1 between the beam splitter unit 3 and the movable mirror 11, and the optical path P2 between the beam splitter unit 3 and the fixed mirror 21. Specifically, the optical path P1 is an optical path ranging from the half mirror surface 31 to the mirror surface 11a of the movable mirror 11 which is located at a reference position with the total reflection mirror surface 32 and the optical surface 33b sequentially interposed therebetween, and is an optical path along which the part of the measurement light L0 proceeds. The optical path P2 is an optical path ranging from the half mirror surface 31 to the mirror surface 21a of the fixed mirror 21 with the optical surface 33c and the first optical function unit 17 sequentially interposed therebetween, and is an optical path through which the remainder of the measurement light L0 proceeds. The support 22 corrects the optical path difference between the optical path P1 and the optical path P2 so that a difference between an optical path length of the optical path P1 (an optical path length in consideration of a refractive index of each medium through which the optical path P1 passes), and an optical path length of the optical path P2 (an optical path length in consideration of a refractive index of each medium through which the optical path P2 passes) decreases (for example, disappears). For example, the support 22 can be formed by the same light-transmitting material as in the optical blocks which constitute the beam splitter unit 3. In this case, the thickness of the support 22 (a length in the Z-axis direction) can be set to be the same as a distance between the half mirror surface 31 and the total reflection mirror surface 32 in the X-axis direction.

[Configuration of Optical Device]

Figure 2:
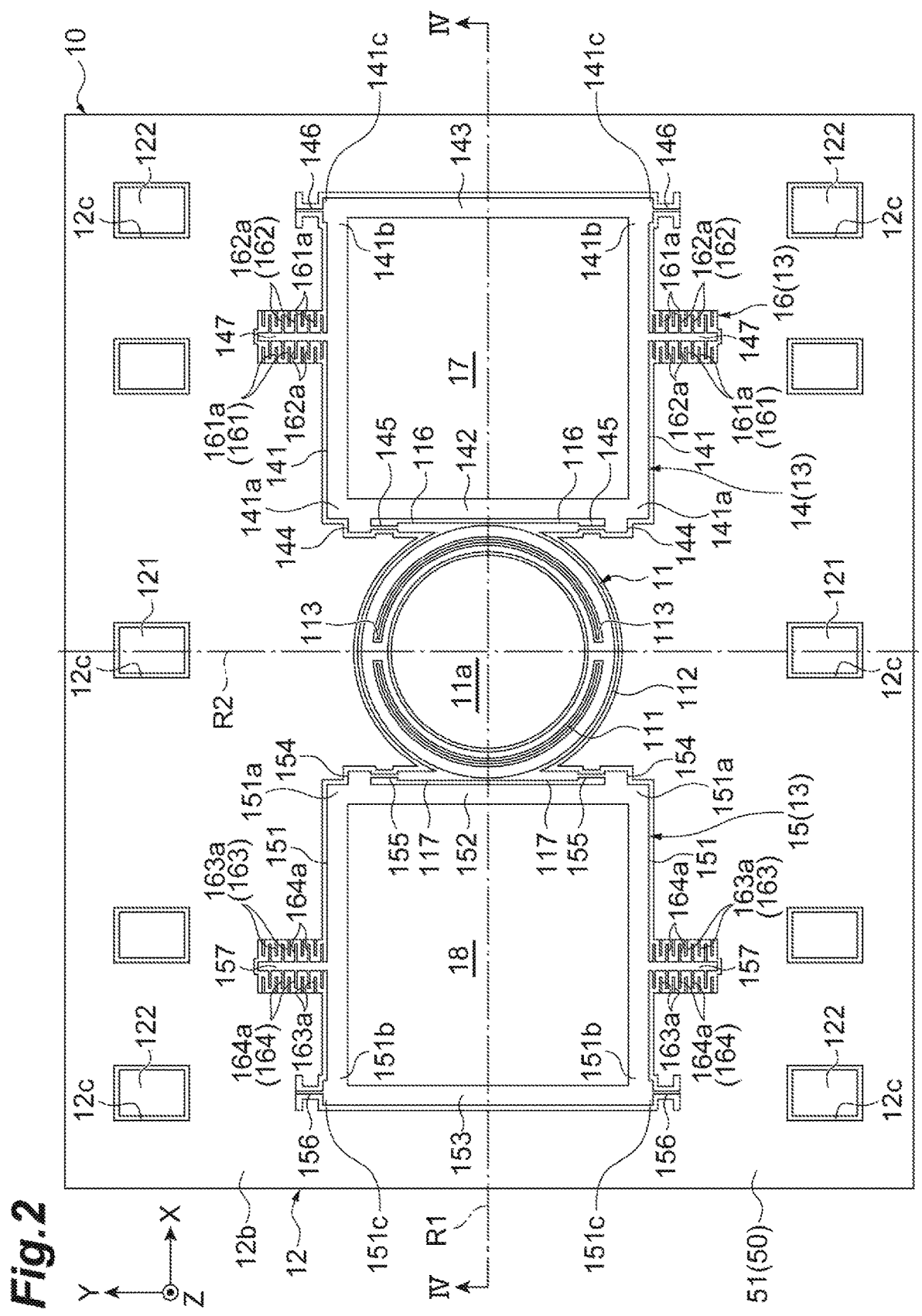
FIG. 2 is a plan view of the optical device illustrated in FIG. 1.
Figure 3:
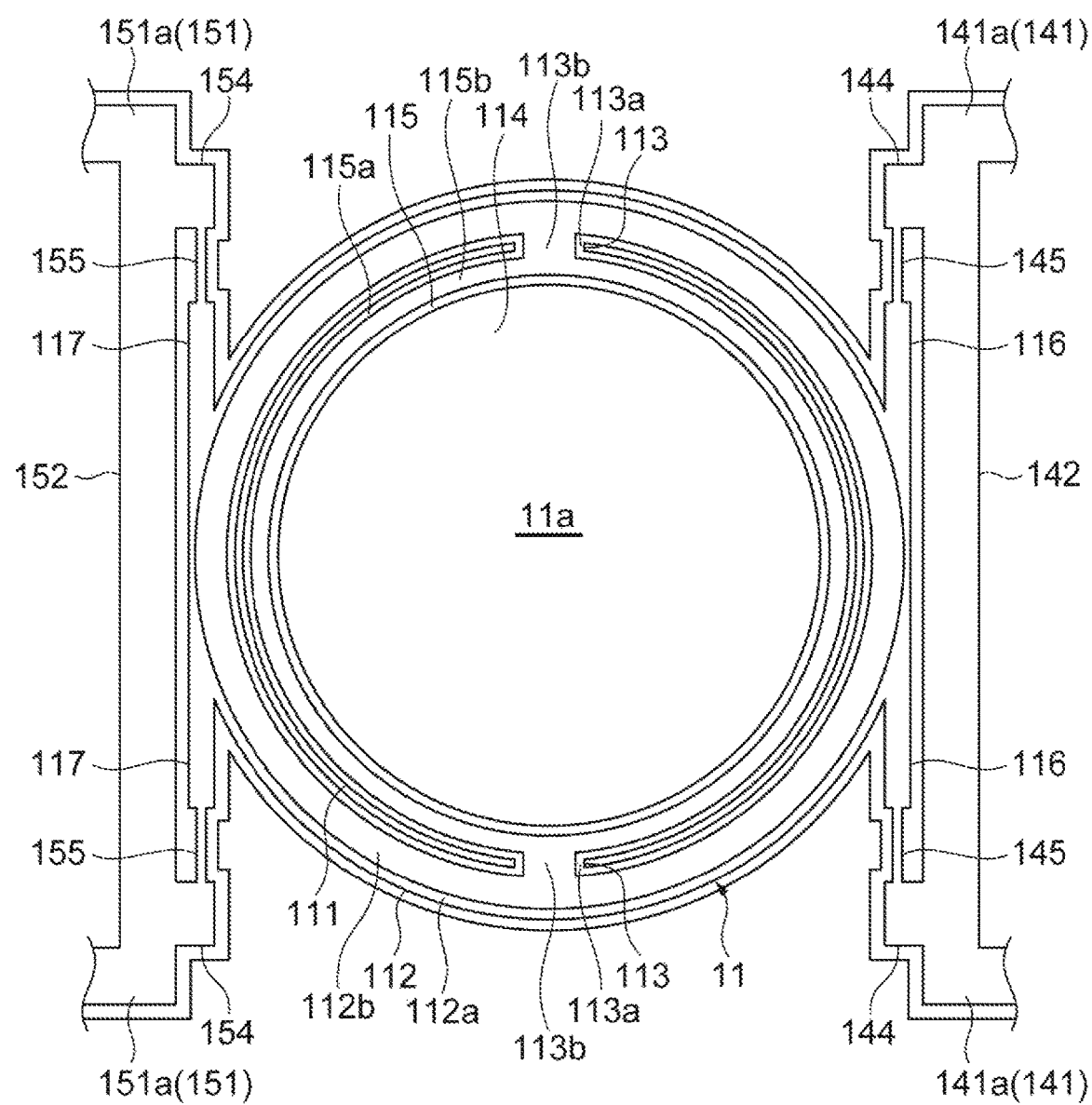
FIG. 3 is a plan view illustrating a part of FIG. 2 in an enlarged manner.
Figure 4:
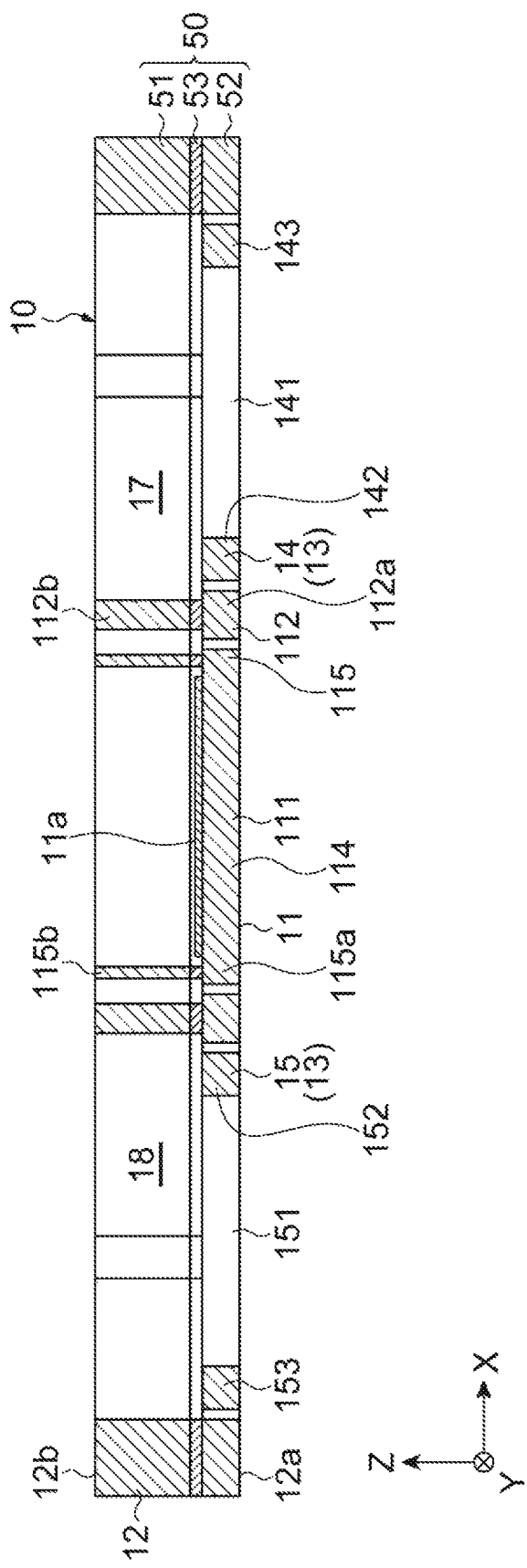
FIG. 4 is a cross-sectional view taken along line IV-IV in FIG. 2.

As illustrated in FIG. 2, FIG. 3, and FIG. 4, a portion of the movable mirror 11 excluding the mirror surface 11a, the base 12, the drive unit 13, the first optical function unit 17, and the second optical function unit 18 are constituted by a silicon on insulator (SOI) substrate 50. That is, the optical device 10 is constituted by the SOI substrate 50. For example, the optical device 10 is formed in a rectangular plate shape. For example, the optical device 10 has a size of approximately 15×10×0.3 (thickness) mm. The SOI substrate 50 includes a support layer 51, a device layer 52, and an intermediate layer 53. The support layer 51 is a first silicon layer. The device layer 52 is a second silicon layer. The intermediate layer 53 is an insulating layer that is disposed between the support layer 51 and the device layer 52.

The base 12 is formed at a part of the support layer 51, the device layer 52, and the intermediate layer 53. The main surface 12a of the base 12 is a surface of the device layer 52 on a side opposite to the intermediate layer 53. A main surface 12b of the base 12 on a side opposite to the main surface 12a is a surface of the support layer 51 on a side opposite to the intermediate layer 53. In the optical module 1, the main surface 12a of the base 12 and the surface 22a of the support 22 are joined to each other (refer to FIG. 1).

The movable mirror 11 is disposed in a state in which an intersection between an axial line R1 and an axial line R2 is set as the central position (gravity center position). The axial line R1 is a straight line that extends in the X-axis direction. The axial line R2 is a straight line that extends in a Y-axis direction (a direction parallel to a Y-axis, a second direction) that is perpendicular to the X-axis direction and the Z-axis direction. The optical device 10 has a shape that is linearly symmetric to each of the axial line R1 and the axial line R2 when viewed from the Z-axis direction.

The movable mirror 11 includes a main body portion 111, a frame portion 112, and a pair of connection portions 113. The main body portion 111 has a circular shape when viewed from the Z-axis direction. The main body portion 111 includes a central portion 114 and an outer edge portion 115. For example, the mirror surface 11a having a circular shape is provided on a surface of the central portion 114 on the main surface 12b side by forming a metal film thereon. The central portion 114 is formed by a part of the device layer 52. The outer edge portion 115 surrounds the central portion 114 when viewed from the Z-axis direction. The outer edge portion 115 includes a first main body portion 115a and a first rib portionrib portion 115b. The first main body portion 115a is formed by a part of the device layer 52.

The first rib portion 115b is formed at a part of the support layer 51 and the intermediate layer 53. The first rib portion 115b is provided on a surface of the first main body portion 115a on the main surface 12b side. The first rib portion 115b is formed so that the thickness of the outer edge portion 115 in the Z-axis direction is larger than the thickness of the central portion 114 in the Z-axis direction. The first rib portion 115b has a circular ring shape when viewed from the Z-axis direction, and surrounds the mirror surface 11a. The first rib portion 115b extends along an outer edge of the main body portion 111 when viewed from the Z-axis direction. In this embodiment, an outer edge of the first rib portion 115b extends along the outer edge of the main body portion 111 with a predetermined interval from the outer edge of the main body portion 111 when viewed from the Z-axis direction. An inner edge of the first rib portion 115b extends along an outer edge of the mirror surface 11a with a predetermined interval from the outer edge of the mirror surface 11a when viewed from the Z-axis direction.

The frame portion 112 surrounds the main body portion 111 with a predetermined interval from the main body portion 111 when viewed from the Z-axis direction. The frame portion 112 has a circular ring shape when viewed from the Z-axis direction. The frame portion 112 includes a second main body portion 112a and a second rib portion 112b. The second main body portion 112a is fixated by a part of the device layer 52.

The second rib portion 112b is formed by a part of the support layer 51 and the intermediate layer 53. The second rib portion 112b is provided on a surface of the second main body portion 112a on the main surface 12b side. The second rib portion 112b is formed so that the thickness of the frame portion 112 in the Z-axis direction is larger than the thickness of the central portion 114 in the Z-axis direction. The second rib portion 112b has a circular ring shape when viewed from the Z-axis direction. An outer edge of the second rib portion 112b extends along an outer edge of the frame portion 112 with a predetermined interval from the outer edge of the frame portion 112 when viewed from the Z-axis direction. An inner edge of the second rib portion 112b extends along an inner edge of the frame portion 112 with a predetermined interval from the inner edge of the frame portion 112 when viewed from the Z-axis direction.

The thickness of the second rib portion 112b in the Z-axis direction is the same as the thickness of the first rib portion 115b in the Z-axis direction. A width of the second rib portion 112b is wider than a width of the first rib portion 115b when viewed from the Z-axis direction. The width of the first rib portion 115b when viewed from the Z-axis direction is a length of the first rib portion 115b in a direction that is perpendicular to an extending direction of the first rib portion 115b, and is a length of the first rib portion 115b in a radial direction of the first rib portion 115b in this embodiment. This is also true of a width of the second rib portion 112b when viewed from the Z-axis direction.

The pair of connection portions 113 connect the main body portion 111 and the frame portion 112. The pair of connection portions 113 are respectively disposed on one side and on the other side in the Y-axis direction with respect to the main body portion 111. Each of the connection portions 113 includes a third main body portion 113a and a third rib portion 113b. The third main body portion 113a is formed by a part of the device layer 52. The third main body portion 113a is connected to the first main body portion 115a and the second main body portion 112a.

The third rib portion 113b is formed by a part of the support layer 51 and the intermediate layer 53. The third rib portion 113b is connected to the first rib portion 115b and the second rib portion 112b. The third rib portion 113b is provided on a surface of the third main body portion 113a on the main surface 12b side. The third rib portion 113b is formed so that the thickness of the connection portion 113 in the Z-axis direction is larger than the thickness of the central portion 114 in the Z-axis direction. The thickness of the third rib portion 113b in the Z-axis direction is the same as the thickness of each of the first rib portion 115b and the second rib portion 112b in the Z-axis direction. A width of the third rib portion 113b is larger than a width of each of the first rib portion 115b and the second rib portion 112b. The width of the third rib portion 113b is a length of the third rib portion 113b along an extending direction of the first rib portion 115b.

The movable mirror 11 further includes a pair of brackets 116 and a pair of brackets 117. The brackets 116 and the brackets 117 are formed by a part of the device layer 52. The brackets 116 extend along the Y-axis direction and have a rectangular shape when viewed from the Z-axis direction. One of the brackets 116 protrudes from a lateral surface of the frame portion 112 toward one side in the Y-axis direction, and the other bracket 116 protrudes from the lateral surface of the frame portion 112 toward the other side in the Y-axis direction. The pair of brackets 116 are disposed on the same central line parallel to the Y-axis direction. The brackets 116 extend from an end of the frame portion 112 on the first optical function unit 17 side.

The brackets 117 extend along the Y-axis direction, and have a rectangular shape when viewed from the Z-axis direction. One of the brackets 117 protrudes from the lateral surface of the frame portion 112 toward the one side in the Y-axis direction, and the other bracket 117 protrudes from the lateral surface of the frame portion 112 toward the other side in the Y-axis direction. The pair of brackets 117 are disposed on the same central line parallel to the Y-axis direction. The brackets 117 extend from an end of the frame portion 112 on the second optical function unit 18 side (a side opposite to the first optical function unit 17).

The drive unit 13 includes a first elastic support unit 14, a second elastic support unit 15, and an actuator unit 16. The first elastic support unit 14, the second elastic support unit 15, and the actuator unit 16 are formed by the device layer 52.

Each of the first elastic support unit 14 and the second elastic support unit 15 is connected between the base 12 and the movable mirror 11. The first elastic support unit 14 and the second elastic support unit 15 support the movable mirror 11 so that the movable mirror 11 is movable along the Z-axis direction.

The first elastic support unit 14 includes a pair of levers 141, a link 142, a link 143, a pair of brackets 144, a pair of first torsion bars (first torsion support portions) 145, a pair of second torsion bars (second torsion support portions) 146, and a pair of electrode support portions 147. The pair of levers 141 are respectively disposed on both sides of the first optical function unit 17 in the Y-axis direction. The levers 141 have a plate shape that extends along a plane perpendicular to the Z-axis direction. In this embodiment, the levers 141 extend along the X-axis direction.

The link 142 bridges ends 141a of the pair of levers 141 on the movable mirror 11 side. The link 142 has a plate shape that extends along a plane perpendicular to the Z-axis direction. The link 142 extends along the Y-axis direction. The link 143 bridges ends 141b of the pair of levers 141 on a side opposite to the movable mirror 11. The link 143 has a plate shape that extends along a plane perpendicular to the Z-axis direction, and extends along the Y-axis direction. In this embodiment, the first optical function unit 17 is an opening that is defined by the pair of levers 141, the link 142, and the link 143. The first optical function unit 17 has a rectangular shape when viewed from the Z-axis direction. For example, the first optical function unit 17 is a cavity. Alternatively, a material having optical transparency with respect to the measurement light L0 may be disposed in the opening that constitutes the first optical function unit 17.

The brackets 144 have a rectangular shape when viewed from the Z-axis direction. The brackets 144 are formed on a surface of the link 142 on the movable mirror 11 side to protrude toward the movable mirror 11 side. One of the brackets 144 is disposed in the vicinity of one end of the link 142, and the other bracket 144 is disposed in the vicinity of the other end of the link 142.

The pair of first torsion bars 145 respectively bridge a tip end of one of the brackets 116 and one of the brackets 144, and a tip end of the other bracket 116 and the other bracket 144. That is, the pair of first torsion bars 145 are respectively connected between the pair of levers 141 and the movable mirror 11. The first torsion bars 145 extend along the Y-axis direction. The pair of first torsion bars 145 are disposed on the same central line parallel to the Y-axis direction.

The pair of second torsion bars 146 respectively bridge an end 141b of one of the levers 141 on a side opposite to the movable mirror 11 and the base 12, and an end 141b of the other lever 141 on a side opposite to the movable mirror 11 and the base 12. That is, the pair of second torsion bars 146 are respectively connected between the pair of levers 141 and the base 12. The second torsion bars 146 extend along the Y-axis direction. The pair of second torsion bars 146 are disposed on the same central line parallel to the Y-axis direction. The end 141b of each of the levers 141 is provided with a protrusion 141c that protrudes toward an outer side in the Y-axis direction, and each of the second torsion bars 146 is connected to the protrusion 141c.

The electrode support portions 147 extend along the Y-axis direction, and have a rectangular shape when viewed from the Z-axis direction. One of the electrode support portions 147 extends from an intermediate portion of one of the levers 141 toward a side opposite to the first optical function unit 17. The other electrode support portion 147 protrudes from an intermediate portion of the other lever 141 toward a side opposite to the first optical function unit 17. The pair of electrode support portions 147 are disposed on the same central line parallel to the Y-axis direction when viewed from the Z-axis direction.

The second elastic support unit 15 includes a pair of levers 151, a link 152, a link 153, a pair of brackets 154, a pair of first torsion bars (first torsion support portions) 155, a pair of second torsion bars (second torsion support portions) 156, and a pair of electrode support portions 157. The pair of levers 151 are respectively disposed on both sides of the second optical function unit 18 in the Y-axis direction. The levers 151 have a plate shape that extends along a plane perpendicular to the Z-axis direction. In this embodiment, the levers 151 extend along the X-axis direction.

The link 152 bridges ends 151a of the pair of levers 151 on the movable mirror 11 side. The link 152 has a plate shape that extends along a plane perpendicular to the Z-axis direction. The link 152 extends along the Y-axis direction. The link 153 bridges ends 151b of the pair of levers 151 on a side opposite to the movable mirror 11. The link 153 has a plate shape that extends along a plane perpendicular to the Z-axis direction, and extends along the Y-axis direction. In this embodiment, the second optical function unit 18 is an opening that is defined by the pair of levers 151, the link 152, and the link 153. The second optical function unit 18 has a rectangular shape when viewed from the Z-axis direction. For example, the second optical function unit 18 is a cavity. Alternatively, a material having optical transparency with respect to the measurement light L0 may be disposed in the opening that constitutes the second optical function unit 18.

The brackets 154 have a rectangular shape when viewed from the Z-axis direction. The brackets 154 are formed on a surface of the link 152 on the movable mirror 11 side to protrude toward the movable mirror 11 side. One of the brackets 154 is disposed in the vicinity of one end of the link 152, and the other bracket 154 is disposed in the vicinity of the other end of the link 152.

The pair of first torsion bars 155 respectively bridge a tip end of one of the brackets 117 and one of the brackets 154, and a tip end of the other bracket 117 and the other bracket 154. That is, the pair of first torsion bars 155 are respectively connected between the pair of levers 151 and the movable mirror 11. The first torsion bars 155 extend along the Y-axis direction. The pair of first torsion bars 155 are disposed on the same central line parallel to the Y-axis direction.

The pair of second torsion bars 156 respectively bridge an end 151b of one of the levers 151 on a side opposite to the movable mirror 11 and the base 12, and an end 151b of the other lever 151 on a side opposite to the movable mirror 11 and the base 12. That is, the pair of second torsion bars 156 are respectively connected between the pair of levers 151 and the base 12. The second torsion bars 156 extend along the Y-axis direction. The pair of second torsion bars 156 are disposed on the same central line parallel to the Y-axis direction. The end 151b of each of the levers 151 is provided with a protrusion 151c that protrudes toward an outer side in the Y-axis direction, and each of the second torsion bars 156 is connected to the protrusion 151c.

The electrode support portions 157 extend along the Y-axis direction, and have a rectangular shape when viewed from the Z-axis direction. One of the electrode support portions 157 extends from an intermediate portion of one of the levers 151 toward a side opposite to the second optical function unit 18. The other electrode support portion 157 protrudes from an intermediate portion of the other lever 151 toward a side opposite to the second optical function unit 18. The pair of electrode support portions 157 are disposed on the same central line parallel to the Y-axis direction when viewed from the Z-axis direction.

The actuator unit 16 moves the movable mirror 11 along the Z-axis direction. The actuator unit 16 includes a pair of fixed comb electrodes 161, a pair of movable comb electrodes 162, a pair of fixed comb electrodes 163, and a pair of movable comb electrodes 164. Positions of the fixed comb electrodes 161 and 163 are fixed. The movable comb electrodes 162 and 164 move in accordance with movement of the movable mirror 11.

One of the fixed comb electrodes 161 is provided on a surface the device layer 52 of the base 12 which faces one of the electrode support portions 147. The other fixed comb electrode 161 is provided on a surface of the device layer 52 which faces the other electrode support portion 147. Each of the fixed comb electrodes 161 includes a plurality of fixed comb fingers 161a which extend along a plane perpendicular to the Y-axis direction. The fixed comb fingers 161a are disposed to be aligned with a predetermined interval in the Y-axis direction.

One of the movable comb electrodes 162 is provided on both surfaces of one of the electrode support portions 147 in the X-axis direction. The other movable comb electrode 162 is provided on both surfaces of the other electrode support portion 147 in the X-axis direction. Each of the movable comb electrodes 162 includes a plurality of movable comb fingers 162a which extend along a plane perpendicular to the Y-axis direction. The movable comb fingers 162a are disposed to be aligned with a predetermined interval in the Y-axis direction.

In one of the fixed comb electrodes 161 and one of the movable comb electrodes 162, the plurality of fixed comb fingers 161a and the plurality of movable comb fingers 162a are alternately disposed. That is, each of the fixed comb fingers 161a of one of the fixed comb electrodes 161 is located between the movable comb fingers 162a of one of the movable comb electrodes 162. In the other fixed comb electrode 161 and the other movable comb electrode 162, the plurality of fixed comb fingers 161a and the plurality of movable comb fingers 162a are alternately disposed. That is, each of the fixed comb fingers 161a of the other fixed comb electrode 161 is located between the movable comb fingers 162a of the other movable comb electrode 162. In the pair of fixed comb electrodes 161 and the pair of movable comb electrodes 162, the fixed comb fingers 161a and the movable comb fingers 162a which are adjacent to each other face each other in the Y-axis direction. For example, a distance between the fixed comb fingers 161a and the movable comb fingers 162a which are adjacent to each other is approximately several μm.

One of the fixed comb electrodes 163 is provided on a surface of the device layer 52 of the base 12 which faces one of the electrode support portions 157. The other fixed comb electrode 163 is provided on a surface of the device layer 52 which faces the other electrode support portion 157. Each of the fixed comb electrodes 163 includes a plurality of fixed comb fingers 163a which extend along a plane perpendicular to the Y-axis direction. The fixed comb fingers 163a are disposed to be aligned with a predetermined interval in the Y-axis direction.

One of the movable comb electrodes 164 is provided on both surfaces of one of the electrode support portions 157 in the X-axis direction. The other movable comb electrode 164 is provided on both surfaces of the other electrode support portion 157 in the X-axis direction. Each of the movable comb electrodes 164 includes a plurality of movable comb fingers 164a which extend along a plane perpendicular to the Y-axis direction. The movable comb fingers 164a are disposed to be aligned with a predetermined interval in the Y-axis direction.

In one of the fixed comb electrodes 163 and one of the movable comb electrodes 164, the plurality of fixed comb fingers 163a and the plurality of movable comb fingers 164a are alternately disposed. That is, each of the fixed comb fingers 163a of one of the fixed comb electrodes 163 is located between the movable comb fingers 164a of one of the movable comb electrodes 164. In the other fixed comb electrode 163 and the other movable comb electrode 164, the plurality of fixed comb fingers 163a and the plurality of movable comb fingers 164a are alternately disposed. That is, each of the fixed comb fingers 163a of the other fixed comb electrode 163 is located between the movable comb fingers 164a of the other movable comb electrode 164. In the pair of fixed comb electrodes 163 and the pair of movable comb electrodes 164, the fixed comb fingers 163a and the movable comb fingers 164a which are adjacent to each other face each other in the Y-axis direction. For example, a distance between the fixed comb fingers 163a and the movable comb fingers 164a which are adjacent to each other is approximately several μm.

A plurality of electrode pads 121 and 122 are provided in the base 12. The electrode pads 121 and 122 are formed on a surface of the device layer 52 in openings 12c formed in the main surface 12b of the base 12 to reach the device layer 52. The electrode pads 121 are electrically connected to the fixed comb electrodes 161 or the fixed comb electrodes 163 through the device layer 52. The electrode pads 122 are electrically connected to the movable comb electrodes 162 or the movable comb electrodes 164 through the first elastic support unit 14 or the second elastic support unit 15. Each of the wires 26 bridges each of the electrode pads 121 and 122 and each of the lead pins 25.

In the optical device 10 constituted as described above, when a voltage is applied to between the plurality of electrode pads 121 and the plurality of electrode pads 122 through the plurality of lead pins 25 and the plurality of wires 26, an electrostatic force occurs between the fixed comb electrodes 161 and the movable comb electrodes 162 which face each other, and between the fixed comb electrodes 163 and the movable comb electrodes 164 which face each other to move the movable mirror 11, for example, toward one side in the Z-axis direction. At this time, the first torsion bars 145 and 155, and the second torsion bars 146 and 156 in the first elastic support unit 14 and the second elastic support unit 15 are twisted, and an elastic force occurs in the first elastic support unit 14 and the second elastic support unit 15. In the optical device 10, when a periodic electric signal is applied to the drive unit 13 through the plurality of lead pins 25 and the plurality of wires 26, it is possible to reciprocate the movable mirror 11 along the Z-axis direction at a resonance frequency level. In this manner, the drive unit 13 functions as an electrostatic actuator.

[Detailed Configuration of Torsion Bar]

Each of the first torsion bars 145 and each of the second torsion bars 146 have a flat plate shape that is perpendicular to the X-axis direction. For example, the first torsion bar 145 is formed in a length (length in the Y-axis direction) of approximately 30 µm to 300 µm, in a width (length in the X-axis direction) of approximately 5 µm to 30 µm, and in a thickness (length in the Z-axis direction) of approximately 30 µm to 100 µm. For example, the second torsion bar 146 is formed in a length (length in the Y-axis direction) of approximately 30 µm to 300 µm, in a width (length in the X-axis direction) of approximately 5 µm to 30 µm, and in a thickness (length in the Z-axis direction) of approximately 30 µm to 100 µm.

In this embodiment, the length of the first torsion bar 145 is the same as the length of the second torsion bar 146. The width of the first torsion bar 145 is wider than the width of the second torsion bar 146. The thickness of the first torsion bar 145 is the same as the thickness of the second torsion bar 146. In a case where at least one end of the first torsion bar 145 on the bracket 116 side and on the bracket 144 side is provided with a widened portion of which a width increases as approaching the end, the length of the first torsion bar. 145 represent a length of the first torsion bar 145 excluding the widened portion, and the width of the first torsion bar 145 represents a width of the first torsion bar 145 excluding the widened portion. In addition, the width of the first torsion bar 145 represents a width (minimum width) at a position of the narrowest width. This is also true of the first torsion bar 155 and the second torsion bars 146 and 156.

A torsional spring constant of the first torsion bar 145 is greater than a torsional spring constant of the second torsion bar 146. For example, the torsional spring constant of the first torsion bar 145 is approximately 0.00004 N·m/rad. For example, the torsional spring constant of the second torsion bar 146 is approximately 0.00003 N·m/rad. For example, the torsional spring constant of the first torsion bar 145 and the torsional spring constant of the second torsion bar 146 are set within a range of approximately 0.000001 N·m/rad to 0.001 N·m/rad. In this embodiment, the length and the thickness of the first torsion bar 145 are the same as the length and the thickness of the second torsion bar 146, and the width of the first torsion bar 145 is wider than the width of the second torsion bar 146, and thus the torsional spring constant of the first torsion bar 145 becomes greater than the torsional spring constant of the second torsion bar 146.

Each of the first torsion bars 155 and each of the second torsion bars 156 have a flat plate shape that is perpendicular to the X-axis direction. For example, the first torsion bar 155 is formed in the same shape as that of the first torsion bar 145. For example, the second torsion bar 156 is formed in the same shape as that of the second torsion bar 146. In this embodiment, a length of the first torsion bar 155 is the same as a length of the second torsion bar 156. A width of the first torsion bar 155 is wider than a width of the second torsion bar 156. The thickness of the first torsion bar 155 is the same as the thickness of the second torsion bar 156.

A torsional spring constant of the first torsion bar 155 is greater than a torsional spring constant of the second torsion bar 156. For example, the torsional spring constant of the first torsion bar 155 is the same as the torsional spring constant of the first torsion bar 145. For example, the torsional spring constant of the second torsion bar 156 is the same as the torsional spring of the second torsion bar 146. In this embodiment, the length and the thickness of the first torsion bar 155 are the same as the length and the thickness of the second torsion bar 156, and the width of the first torsion bar 155 is wider than the width of the second torsion bar 156, and thus the torsional spring constant of the first torsion bar 155 becomes greater than the torsional spring constant of the second torsion bar 156.

Function and Effect

Figure 5:
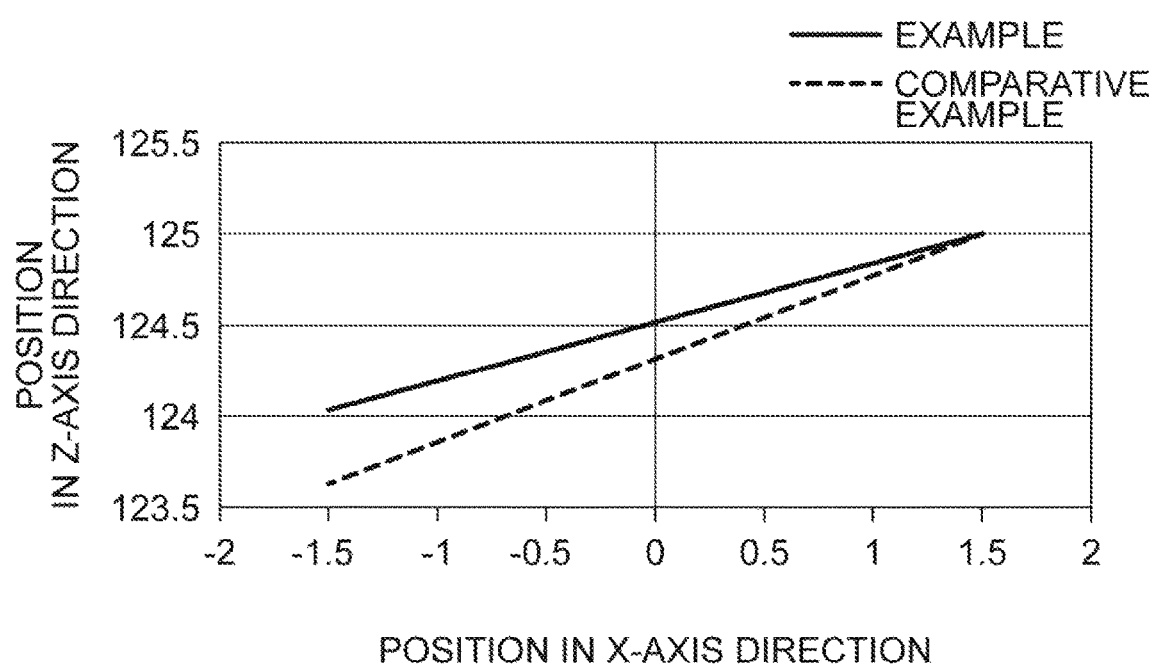
FIG. 5 is a graph showing an inclination of a mirror surface during movement in an example and a comparative example.

An operation and an effect of the optical device 10 will be described with reference to FIG. 5. FIG. 5 is a graph showing an inclination of the mirror surface 11a during movement in an example and a comparative example. The example corresponds to the optical device 10 according to the embodiment. In the example, the width of the first torsion bar 145 is set to 18 the width of the second torsion bar 146 is set to 15 µm, the width of the first torsion bar 155 is set to 18 µm, and the width of the second torsion bar 156 is set to 16 µm. The length of each of the first torsion bars 145 and 155 and each of the second torsion bars 146 and 156 is set to 100 µm, and the thickness thereof is set to 70 µm.

In the comparative example, the width of the first torsion bar 145 is set to 16 µm, the width of the second torsion bar 146 is set to 17 µm, the width of the first torsion bar 155 is set to 16 µm, and the width of the second torsion bar 156 is set to 18 µm. The length of each of the first torsion bars 145 and 155 and each of the second torsion bars 146 and 156 is set to 100 µm, and the thickness thereof is set to 70 µm. The other configurations of the comparative example are set in a similar manner as in the example.

The example corresponds to a case where the width of the second torsion bar 146 is narrowed by 1 µm in comparison to a configuration in which the width of the first torsion bars 145 and 155 is 18 µm, and the width of the second torsion bars 146 and 156 is 16 µm. The comparative example corresponds to a case where the width of the second torsion bar 146 is narrowed by 1 µm in comparison to a configuration in which the width of the first torsion bars 145 and 155 is 16 µm, and the width of the second torsion bars 146 and 156 is 18 µm.

In the example, the configuration before the width of the second torsion bar 146 is narrowed, the torsional spring constant of the first torsion bar 145 is greater than the torsional spring constant of the second torsion bar 146, and the torsional spring constant of the first torsion bar 155 is greater than the torsional spring constant of the second torsion bar 156. In the comparative example, in the configuration before the width of the second torsion bar 146 is narrowed, the torsional spring constant of the first torsion bar 145 is smaller than the torsional spring constant of the second torsion bar 146, and the torsional spring constant of the first torsion bar 155 is smaller than the torsional spring constant of the second torsion bar 156.

A deviation of the shape of the second torsion bar 146 as described above may occur due to the following reason. The optical device 10 is formed in the SOI substrate 50 by using an MEMS technology (patterning and etching) and the like. In the second torsion bar 146, processing in a longitudinal direction is performed by patterning, and processing in a width direction is performed by etching. Therefore; a deviation is less likely to occur in the length of the second torsion bar 146. On the other hand, a deviation may occur in the width of the second torsion bar 146 due to a manufacturing error or the like. Processing of the second torsion bar 146 in a thickness direction is performed by etching in which the intermediate layer 53 is used as an etching stop layer, and thus a deviation is less likely to occur in the thickness of the second torsion bar 146.

As shown in FIG. 5, as in the example and the comparative example, in a case where the width of the second torsion bar 146 is narrowed, the mirror surface 11a (movable mirror 11) is inclined from a target posture when the movable mirror 11 moves in the Z-axis direction. In the example and comparative example, the target posture is a posture in which the mirror surface 11a is perpendicular to the Z-axis direction.

As shown in FIG. 5, in the example, an inclination of the mirror surface 11a from the target posture is smaller in comparison to the comparative example. In this manner, it is possible to suppress the inclination of the mirror surface 11a from the target posture by making the torsional spring constant of the first torsion bars 145 and 155 greater than the torsional spring constant of the second torsion bars 146 and 156. This is clear from the fact that the inclination of the mirror surface 11a from the target posture is smaller in comparison to the comparison example even though a variation rate (a rate of a variation amount with respect to an original length) of the width of the second torsion bar 146 in the example is greater in comparison to the variation rate in the comparative example.

As described above, in the optical device 10, the torsional spring constant of the first torsion bar 145 connected between the lever 141 and the movable mirror 11 is greater than the torsional spring constant of the second torsion bar 146 connected between the lever 141 and the base 12. Accordingly, even in a case where a deviation occurs in the shape of at least one of the first torsion bar 145 and the second torsion bar 146 due to the manufacturing error or the like, it is possible to suppress the movable mirror 11 from being inclined from the target posture when the movable mirror 11 moves in the Z-axis direction. In addition, the torsional spring constant of the first torsion bar 155 connected between the lever 151 and the movable mirror 11 is greater than the torsional spring constant of the second torsion bar 156 connected between the lever 151 and the base 12. Accordingly, even in a case where a deviation occurs in the shape of at least one of the first torsion bar 155 and the second torsion bar 156 due to the manufacturing error or the like, it is possible to suppress the movable mirror 11 from being inclined from the target posture when the movable mirror 11 moves in the Z-axis direction. As a result, according to the optical device 10, it is possible to suppress a deterioration of the optical characteristics which is caused by the variation of the shape of the first torsion bars 145 and 155 and the second torsion bars 146 and 156. In the optical device 10, even in a case where the width of the second torsion bar 146 is narrowed and a case where the width of the second torsion bar 146 is widened, it is also possible to suppress the movable mirror 11 from being inclined from the target posture. In addition, even in a case where a deviation occurs in at least one of the length and the thickness of the second torsion bar 146, it is possible to suppress the movable mirror 11 from being inclined from the target posture. Similarly, even in a case where a deviation occurs in the shape of the second torsion bar 146 and a case where a deviation occurs in the shape of at least one of the first torsion bars 145 and 155 and the second torsion bar 156, it is possible to suppress the movable mirror 11 from being inclined from the target posture.

In addition, in the optical device 10, the width of the first torsion bars 145 and 155 is wider than the width of the second torsion bars 146 and 156 when viewed from the Z-axis direction. According to this, it is possible to make the torsional spring constant of the first torsion bars 145 and 155 to be approximately greater than the torsional spring constant of the second torsion bars 146 and 156.

In addition, in the optical device 10, the base 12, the movable mirror 11, the first elastic support unit 14, and the second elastic support unit 15 are constituted by the SOI substrate 50. According to this, in the optical device 10 formed by the MEMS technology, it is possible to suppress a deterioration of optical characteristic which is caused by the variation of the shape of the first torsion bars 145 and 155 and the second torsion bars 146 and 156.

In addition, the optical device 10 includes the fixed comb electrodes 161 and 163 which are provided in the base 12 and include the plurality of fixed comb fingers 161a and 163a, and the movable comb electrodes 162 and 164 which are provided in the first elastic support unit 14 and the second elastic support unit 15 and include the plurality of movable comb fingers 162a and 164a which are disposed alternately with the plurality of fixed comb fingers 161a and 163a. According to this, it is possible to realize simplification and low power consumption of the actuator unit 16 configured to move the movable mirror 11.

In addition, the optical device 10 includes the first elastic support unit 14 and the second elastic support unit 15. According to this, it is possible to stabilize an operation of the movable mirror 11, for example, in comparison to a case where only one elastic support unit is provided. In addition, it is possible to further reduce a total number of the torsion bars in comparison to a case where three or more elastic support units are provided. As a result, it is possible to secure a spring constant of each of the torsion bars, and it may be less likely to be susceptible to an influence due to the variation of the shape of the torsion bar.

Hereinbefore, an embodiment of the present disclosure has been described, but the present disclosure is not limited to the embodiment. Materials and shapes of respective configurations are not limited to the above-described materials and shapes, and various materials and shapes can be employed.

In the embodiment, the width of the first torsion bar 145 may be the same as the width of the second torsion bar 146, and the length of the first torsion bar 145 may be shorter than the length of the second torsion bar 146, and thus the torsional spring constant of the first torsion bar 145 may be greater than the torsional spring constant of the second torsion bar 146. Similarly, the width of the first torsion bar 155 may be the same as the width of the second torsion bar 156, and the length of the first torsion bar 155 may be shorter than the length of the second torsion bar 156, and thus the torsional spring constant of the first torsion bar 155 may be greater than the torsional spring constant of the second torsion bar 156.

Even in this case, as in the embodiment, it is possible to suppress a deterioration of optical characteristics which is caused by the variation of the shape of the first torsion bars 145 and 155 and the second torsion bars 146 and 156. That is, the torsional spring constant of the first torsion bar 145 may be greater than the torsional spring constant of the second torsion bar 146, and a magnitude relationship of each of the length, the width, and the thickness between the first torsion bar 145 and the second torsion bar 146 may be selected as appropriate. This is also true of the first torsion bar 155 and the second torsion bar 156.

In the embodiment, each of the main body portion 111 and the mirror surface 11a may have any shape such as a rectangular shape and an octagonal shape when viewed from the Z-axis direction. The frame portion 112 may have any ring shape such as a rectangular ring shape and an octagonal ring shape when viewed from the Z-axis direction. The frame portion 112 and the connection portion 113 may be omitted. Each of the first rib portion 115b, the second rib portion 112b, and the third rib portion 113b may be formed in any shape, and may be omitted. In the embodiment, the first torsion support portions are constituted by the plateshaped first torsion bar 145, but the configuration of the first torsion support portions is not limited to the configuration. The first torsion bars 145 may have any shape such as a rod shape. The first torsion support portions may be constituted by connecting a plurality of (for example, two) torsion bars in series through a connection portion. The configurations are also true of the first torsion bar 155 and the second torsion bars 146 and 156 (second torsion support portions). For example, the second torsion support portions may be constituted by connecting a plurality of (for example, three) torsion bars in series through a connection portion.

In the embodiment, the links 143 and 153 may be omitted. In this case, each of the first optical function unit 17 and the second optical function unit 18 may be constituted by an opening that is formed in the SOI substrate 50. The first optical function unit 17 and the second optical function unit 18 may have any cross-sectional shape such as a circular shape and an octagonal shape. The movable comb electrodes 162 and 164 may be provided in the movable mirror 11, and may be disposed, for example, along the outer edge of the frame portion 112. The optical device 10 may include a movable unit provided with another optical function unit other than the mirror surface 11a instead of the movable mirror 11. Examples of the other optical function unit include a lens. The actuator unit 16 is not limited to the electrostatic actuator, and may be, for example, a piezoelectric type actuator, an electromagnetic type actuator, or the like. The optical module 1 is not limited to constitute the FTIR, and may constitute another optical system. The optical device 10 may be constituted by a member other than the SOI substrate 50, and may be constituted, for example, by a substrate formed from only silicon.

REFERENCE SIGNS LIST

10: optical device, 11: movable mirror (movable unit), 11a: mirror surface (optical function unit), 12a: main surface, 12: base, 14: first elastic support unit, 15: second elastic support unit, 141, 151: lever, 145, 155: first torsion bar (first torsion support portion), 146, 156: second torsion bar (second torsion support portion), 161, 163: fixed comb electrode, 161a, 163a: fixed comb finger, 162, 164: movable comb electrode, 162a, 164a: movable comb finger.

The invention claimed is:

1. An optical device comprising:
a base that includes a main surface;
a movable unit that includes an optical function unit; and
an elastic support unit that is connected between the base and the movable unit, and supports the movable unit so that the movable unit is movable along a first direction perpendicular to the main surface,
wherein the elastic support unit includes a lever, a first torsion support portion, and a second torsion support portion, wherein the first torsion support member extends along a second direction perpendicular to the first direction, the first torsion support member is connected between the lever and the movable unit, the second torsion support portion extends along the second direction, and the second torsion support member is connected between the lever and the base, and
a torsional spring constant of the first torsion support portion is greater than a torsional spring constant of the second torsion support portion.

2. The optical device according to claim 1, wherein a width of the first torsion support portion is wider than a width of the second torsion support portion when viewed from the first direction.

3. The optical device according to claim 1, wherein a length of the first torsion support portion is shorter than a length of the second torsion support portion when viewed from the first direction.

4. The optical device according to claim 1, wherein the base, the movable unit, and the elastic support unit are constituted by an SOI substrate.

5. The optical device according to claim 1, further comprising:
a fixed comb electrode that is provided to the base and includes a plurality of fixed comb fingers; and
a movable comb electrode that is provided to at least one of the movable unit and the elastic support unit and includes a plurality of movable comb fingers which are disposed alternately with the plurality of fixed comb fingers.

6. The optical device according to claim 1, consisting of a pair of the elastic support unit.

* * * * *